US011175333B2

(12) United States Patent
Lichtenwalner et al.

(10) Patent No.: US 11,175,333 B2
(45) Date of Patent: Nov. 16, 2021

(54) SYSTEM AND PROCESS FOR IMPLEMENTING ACCELERATED TEST CONDITIONS FOR HIGH VOLTAGE LIFETIME EVALUATION OF SEMICONDUCTOR POWER DEVICES

(71) Applicant: Cree, Inc., Durham, NC (US)

(72) Inventors: Daniel Jenner Lichtenwalner, Raleigh, NC (US); Satyaki Ganguly, Cary, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 16/806,754

(22) Filed: Mar. 2, 2020

(65) Prior Publication Data
US 2021/0270886 A1 Sep. 2, 2021

(51) Int. Cl.
G01R 31/02 (2006.01)
G01R 31/26 (2020.01)
H01L 21/66 (2006.01)
G06F 11/36 (2006.01)

(52) U.S. Cl.
CPC ..... *G01R 31/2642* (2013.01); *G01R 31/2621* (2013.01); *H01L 22/14* (2013.01); *H01L 22/34* (2013.01); *G01R 31/26* (2013.01); *G01R 31/2601* (2013.01); *G06F 11/3688* (2013.01); *H01L 2224/13099* (2013.01); *H01L 2924/00* (2013.01); *H01L 2924/0002* (2013.01); *H01L 2924/00014* (2013.01)

(58) Field of Classification Search
CPC ......... H01L 2924/0002; H01L 2924/00; H01L 2924/00014; H01L 22/34; H01L 22/14; H01L 2224/13099; G01R 31/2601; G01R 31/26; G01R 31/2642; G01R 31/2621; G06F 11/3688
USPC ......... 324/71, 378, 403, 415, 425, 500, 537, 324/762.01
See application file for complete search history.

(56) References Cited

U.S. PATENT DOCUMENTS

| | | | | |
|---|---|---|---|---|
| 2009/0058450 A1* | 3/2009 | Albert | ............... | G01R 31/2868 324/750.05 |
| 2016/0061880 A1* | 3/2016 | Uppal | ............... | G01R 31/12 324/762.01 |
| 2018/0301386 A1* | 10/2018 | Smith | ............... | H01L 22/20 |

OTHER PUBLICATIONS

"Radiation Hardened Power MOSFET Thru-Hole (Low-Ohmic TO-254AA)" International IOR Rectifier, PD-96991B, 2N7586T1, IRHMS67264, 250V, N-Channel, R6 Technology, Mar. 2014; 9 Pages; Retrieved from www.irf.com.

* cited by examiner

*Primary Examiner* — Raul J Rios Russo
(74) *Attorney, Agent, or Firm* — BakerHostetler

(57) ABSTRACT

A process and system for testing includes: arranging devices in a temperature-controlled environment; applying a negative gate bias voltage (Vgs) to the devices; applying a drain voltage (Vds) to the devices; measuring currents and/or voltages of the devices to generate device test data; determining a failure of one or more of the devices based on the device test data generated from the device currents and/or the voltages to generate failure data; and outputting the failure data for the of devices.

53 Claims, 11 Drawing Sheets

SYSTEM AND PROCESS FOR IMPLEMENTING ACCELERATED TEST CONDITIONS FOR HIGH VOLTAGE LIFETIME EVALUATION OF SEMICONDUCTOR POWER DEVICES

BACKGROUND OF THE DISCLOSURE

1. Field of the Disclosure

This disclosure is directed to a system for implementing accelerated test conditions for high voltage lifetime evaluation of semiconductor power devices. This disclosure is further directed to a process for implementing accelerated test conditions for high voltage lifetime evaluation of semiconductor power devices.

2. Related Art

Determining a lifetime of semiconductor power devices helps to ensure a reliability of the semiconductor power devices as well as a reliability of the application implementing the semiconductor power devices. Typically, determining a lifetime of semiconductor power devices includes evaluating device lifetime of the semiconductor power devices under an accelerated life test high temperature reverse bias (ALT-HTRB) test, Often, these types of ALT-HTRB tests take 10,000 hours to 20000 hours or more to obtain enough failures to achieve the data needed for a lifetime determination. This is a substantial amount of time needed in order to obtain the desired data. Moreover, this substantial amount of time results in increased testing costs and delays in obtaining and analyzing the data critical for ensuring reliability, determining causes of failures, and determining subsequent remedial measures to address the same. Numerous other approaches to analyzing semiconductor devices have been implemented as well, For example, tests related to radiation hardness verification of semiconductor devices for space applications have been utilized. However, such tests are related to testing within radiation environments for radiation hardness. For example, testing to evaluate performance under device ion irradiation. Such tests are distinguished from testing power semiconductor device lifetime under normal ambient conditions.

Accordingly, a system and process for implementing accelerated test conditions for high voltage lifetime evaluation of semiconductor power devices is needed that reduces the amount of time needed to obtain desired data for lifetime determination of semiconductor power devices.

SUMMARY OF THE DISCLOSURE

One aspect includes a process for testing semiconductor power devices that includes: arranging an N number of devices in a temperature-controlled environment such that a temperature of the N number of devices is near one of the following: a maximum temperature rated for the N number of devices and a minimum temperature rated for the N number of devices; applying a negative gate bias voltage (Vgs) to the N number of devices; applying a drain voltage (Vds) to the N number of devices; measuring currents and/or device voltages of the N number of devices to generate device test data; determining a failure of one or more of the N number of devices based on the device test data generated from the device currents and/or the device voltages that are measured to generate failure data; and outputting the failure data for the N number of devices.

One aspect includes a system for testing semiconductor power devices that includes: a temperature-controlled environment configured to hold an N number of devices and maintain a temperature of the N number of devices near one of the following: a maximum temperature rated for the N number of devices and a minimum temperature rated for the N number of devices; at least one testing device configured to apply a negative gate bias voltage (Vgs) to the N number of devices; the at least one testing device further configured to apply a drain voltage (Vds) to the N number of devices; the at least one testing device further configured to measure device currents and/or device voltages of the N number of devices to generate device test data; the at least one testing device further configured to determine a failure of one or more of the N number of devices based on the device test data generated from the device currents and/or the device voltages measured by the at least one testing device to generate failure data; and the at least one testing device further configured to output the failure data for the N number of devices.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
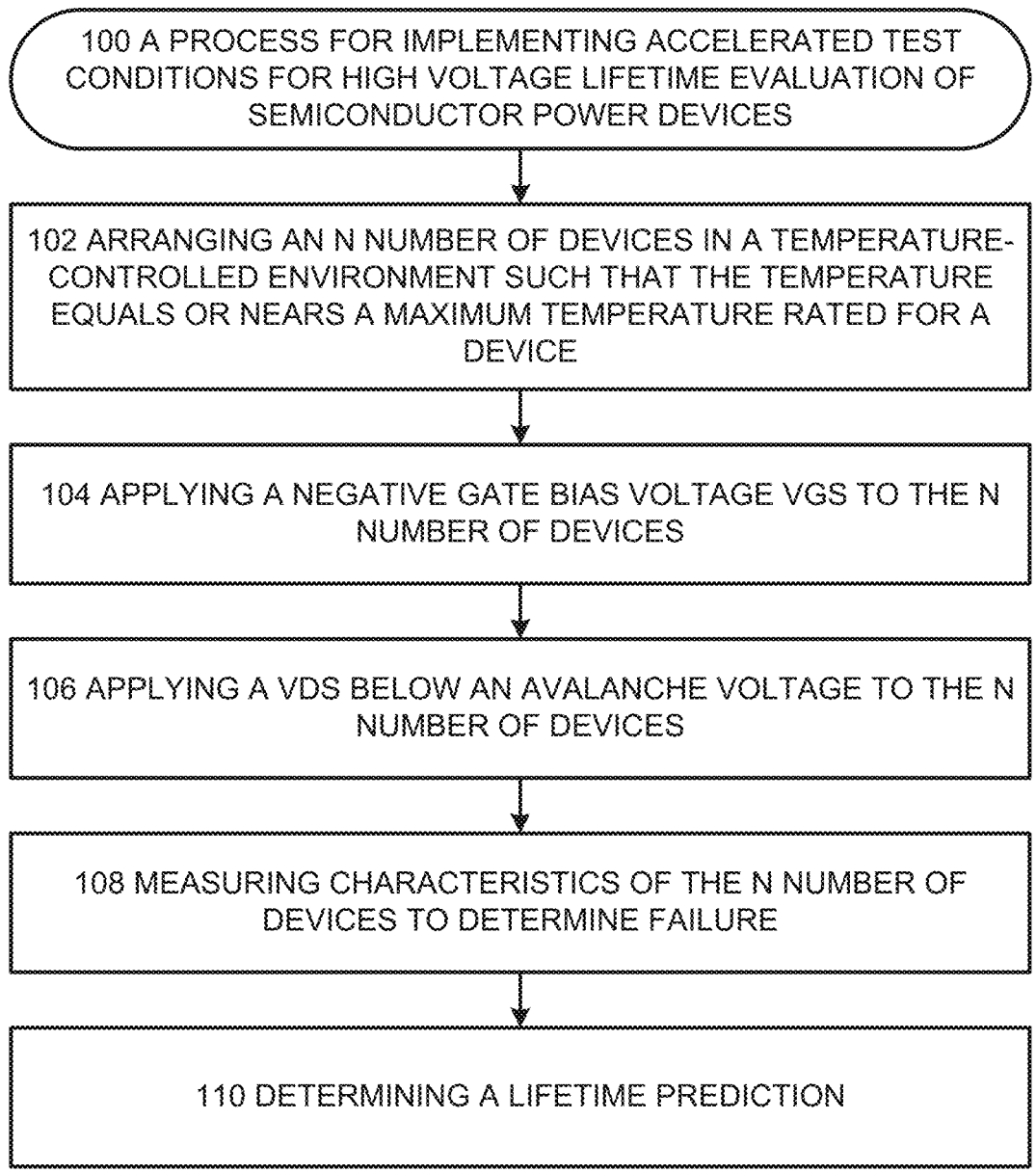
FIG. 1 illustrates a process for implementing accelerated test conditions for high voltage lifetime evaluation of semiconductor power devices according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

In this regard, the disclosure is directed to a system and process for implementing accelerated test conditions for high voltage lifetime evaluation of semiconductor power devices that greatly reduces the amount of time needed to obtain desired data for lifetime determination of semiconductor power devices.

The disclosure describes a system and process implementing approaches to decrease the testing time for properly evaluating device lifetime of high voltage devices under an accelerated life test high temperature reverse bias (ALT-HTRB) test. As described above, the typical types of ALT-HTRB lifetime tests take as long as 10,000 hours-20,000 hours or more to obtain enough failures to achieve the data needed for lifetime determination.

The disclosure provides and describes a system and process implementing test conditions such that a lifetime can be determined with far less testing time. Thus, the time for new device evaluation can be significantly shortened.

Typically, an ALT-HTRB test is used to determine device lifetime at high field on a power semiconductor drain or collector terminal. However, semiconductor power devices, such as vertical power metal-oxide-semiconductor field-effect transistor (MOSFET) devices, will go into a semiconductor avalanche breakdown at a given drain voltage, at which point no additional increase in the device field is possible. Thus, the ability to accelerate the field to increase the failure rate and achieve results more quickly is limited.

The disclosed process and system implements test conditions that allow failure times to be reduced by at least two factors. First, a negative gate bias voltage (Vgs) (or field) is applied during the test to increase the electric field in the critical regions of the device. This results in providing higher field and faster failure rates. The disclosed process and system applies to Metal-Oxide-Silicon (MOS) devices in general, but is very effective for devices such as vertical MOSFETs or vertical insulated-gate bipolar transistors (IGBTs), in which the MOS region is shielded (by the junction gate field-effect transistor (JFET) region) from the main drift region. Therefore, the electric fields are lower near the critical MOS region, and thus can be significantly increased by the negative gate bias. Second, both low temperature and high temperature conditions are tested. In this regard, the temperature effects help to isolate the effects of the gate field and the semiconductor field on the failure, revealing the failure mechanism. For example, failure mechanisms such as gate oxide failure, semiconductor-related failure, and/or the like.

In the simulation results described in the disclosure, if a particular exemplary device undergoes an avalanche breakdown just above 1500V (an equilibrium, sustainable event if currents are low enough), then the fields in the particular exemplary device cannot be increased above the 1500V level. However, the negative gate bias voltage (Vgs) taught by the disclosure allows a higher field for a device, which results in a faster failure time than for test conditions without application of a negative gate bias voltage (Vgs).

As a result of the negative bias adding higher field, it is analogous to operating at a higher drain voltage (Vds) bias (which cannot be accomplished without a negative gate bias voltage (Vgs) due to the avalanche voltage that occurs around 1500V drain voltage (Vds) for the particular exemplary device and sets a maximum to the fields in the device at VGS=0 V. Although reference to a particular exemplary device is described, similar results are contemplated for other implementations of power semiconductor devices.

FIG. 1 illustrates a process for implementing accelerated test conditions for high voltage lifetime evaluation of semiconductor power devices according to the disclosure.

In particular, FIG. 1 illustrates a testing process 100 for implementing accelerated test conditions for high voltage lifetime evaluation of semiconductor power devices. It should be noted that the testing process 100 is merely exemplary and may be modified consistent with the various aspects disclosed herein. In particular, the testing process 100 may be performed in a different order consistent with the aspects described herein. Moreover, the testing process 100 may be modified to have more or fewer processes consistent with the various aspects disclosed herein.

The testing process 100 of FIG. 1 may include arranging an N number of devices in a temperature-controlled environment such that the temperature equals or nears a maximum temperature rated for the devices as illustrated in box 102. In this regard, the temperature may be slightly lower or slightly higher. In this regard, nears as utilized by the disclosure is meant to define a value within 0% to 20%, 0% to 5%, 5% to 10%, 10% to 15%, or 15% to 20% of the noted value. In particular, box 102 may include arranging the N devices where N is a whole number and the devices include an N number of power semiconductor devices 10.

Figure 5:
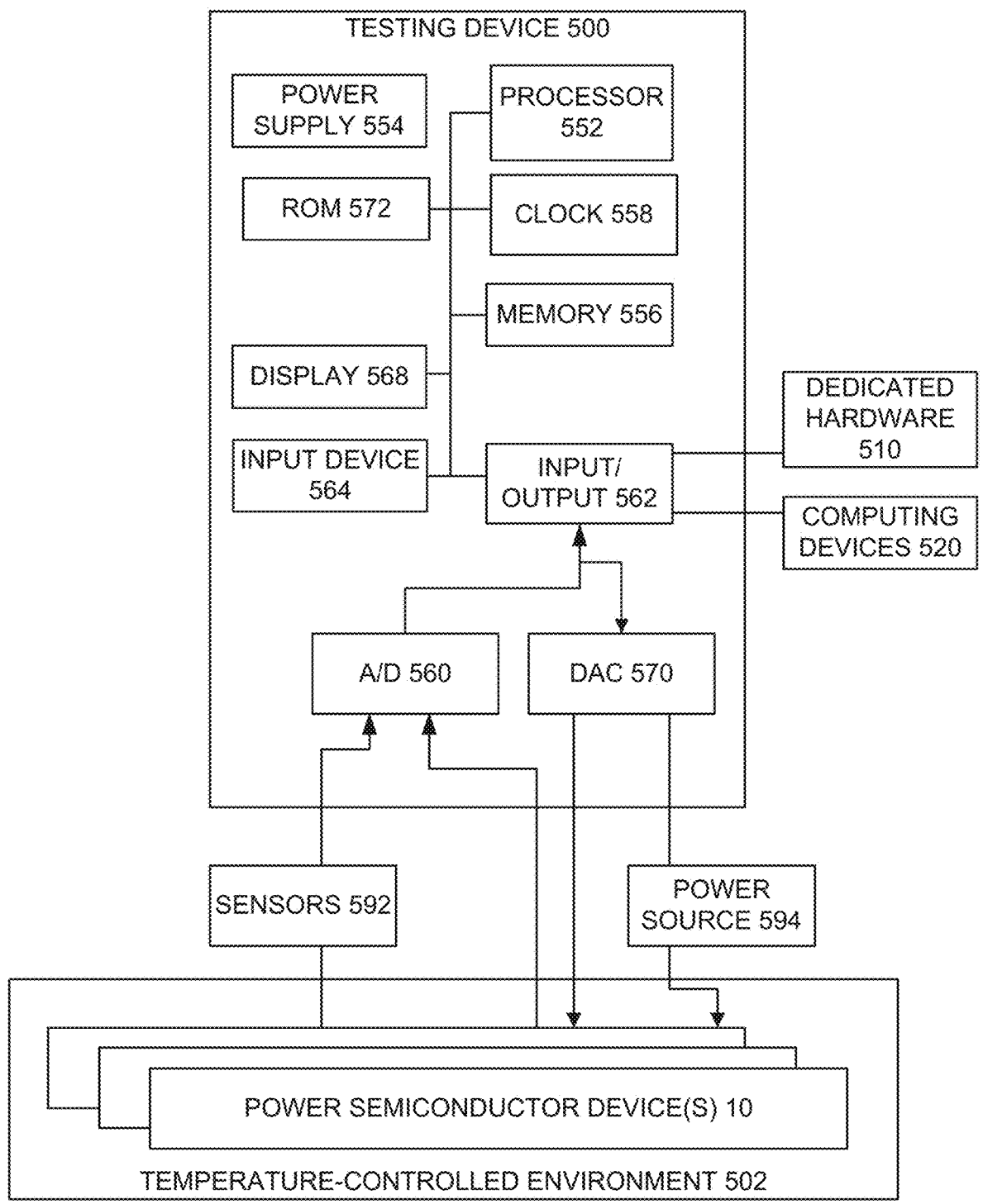
FIG. 5 illustrates an exemplary testing device that may be utilized at least in part for the processes according to the disclosure.

In particular, box 102 of the testing process 100 may be implemented with a testing device 500 as described in further detail with respect to FIG. 5. However, box 102 may be implemented utilizing other configurations where the testing device may be electrically connected to one or more of a gate, a source, a drain, and the like of the device. Accordingly, the testing device may operate the device by applying various voltages and/or currents to the device as set forth by the testing process 100. In this regard, the testing device may include at least one power source having at least one controllable voltage and/or current output that may operate the device by applying various voltages and/or currents to the device as set forth by the testing process 100. Moreover, the testing device may include at least one sensor, such as a current sensor, a voltage sensor, a temperature sensor, and the like to measure and determine various characteristics of the device including physical quantities. Additionally, the testing process 100 in conjunction with the testing device such as the testing device 500 may provide a temperature-controlled environment such that the temperature equals or nears a maximum temperature rated for a device. The temperature-controlled environment may be provided by a temperature-controlled environment system 502 illustrated in FIG. 5 and described below.

The testing process 100 of FIG. 1 may include applying a negative gate bias voltage (Vgs) to the N number of devices as illustrated in box 104, In particular, box 104 of the testing process 100 may be implemented with a testing device 500 as described in further detail with respect to FIG. 5. However, box 104 may be implemented utilizing other configurations as described herein. In this regard, the testing process 100 in conjunction with the testing device 500 may apply a negative gate bias voltage (Vgs) to the N number of devices as illustrated in box 104. In particular, the testing process 100 may apply different gate bias voltage (Vgs) levels of a negative gate bias voltage (Vgs) to the N number of devices.

The different Vgs levels of a negative gate bias voltage (Vgs) applied to the N number of devices may include a negative gate bias voltage (Vgs) of 0% to 20% of a device rated Vgs, a negative gate bias voltage (Vgs) of 20% to 40% of a device rated Vgs, a negative gate bias voltage (Vgs) of 40% to 60% of a device rated Vgs, a negative gate bias voltage (Vgs) of 60% to 80% of a device rated Vgs, and/or a negative gate bias voltage (Vgs) of 80% to 100% of a device rated Vgs. In this regard, there may be M different Vgs levels of a negative gate bias voltage (Vgs) applied to the N number of devices, wherein M a whole number.

In some aspects, the M different Vgs levels may be equal to the N number of devices. In other words, each of the N number of devices may include a different level of a negative gate bias voltage (Vgs). In some aspects, the M different Vgs levels may not be equal to N number of devices. In other words, some of the N number of devices may include a same level of a negative gate bias voltage (Vgs).

In one aspect, the N number of devices may be 2 devices-1000 devices, 2 devices-40 devices, 40 devices-60 devices, 60 devices-100 devices, 100 devices-200 devices, 200 devices-400 devices, 400 devices-600 devices, 600 devices-800 devices, or 800 devices-1000 devices. In particular, the N number of devices may be selected according to device qualification guidelines to the allow parts per million (PPM) failure rates to be calculated. In one aspect, the M different Vgs levels may be 2 levels-20 levels, 2 levels-4 levels, 4 levels-6 levels, 6 levels-10 levels, 10 levels-14 levels, or 14 levels-20 levels.

In one exemplary aspect, the M different Vgs levels may be 3 different Vgs levels that are near 0V, negative 10V, and negative 20V for a device that nears a rated+20 Vgs use. In one exemplary aspect, the M different Vgs levels may be 3 different Vgs levels that include 0V, negative 10V, and negative 20V for a device rated for +20 Vgs use.

The testing process 100 of FIG. 1 may include applying a drain voltage (Vds) below an avalanche voltage to the N number of devices as illustrated in box 106. In particular, box 106 of the testing process 100 may be implemented with a testing device 500 as described in further detail with respect to FIG. 5. However, box 106 may be implemented utilizing other configurations as described herein. In this regard, the testing process 100 in conjunction with the testing device 500 may apply a drain voltage (Vds) below an avalanche voltage to the N number of devices as illustrated in box 106. In particular, the drain voltage (Vds) may be 70% to 100% of the avalanche voltage, 70% to 80% of the avalanche voltage, 80% to 90% of the avalanche voltage, 90% to 94% of the avalanche voltage, 94% to 97% of the avalanche voltage, or 97% to 100% of the avalanche voltage. In one exemplary aspect, the drain voltage (Vds) below the avalanche voltage may near 96% of V (avalanche). In one exemplary aspect, the drain voltage (Vds) below the avalanche voltage may be 96% of V (avalanche).

The testing process 100 of FIG. 1 may include measuring characteristics of the N number of devices to determine failure as illustrated in box 108. In particular, box 108 of the testing process 100 may be implemented with a testing device 500 as described in further detail with respect to FIG. 5. However, box 108 may be implemented utilizing other configurations as described herein. In this regard, the testing process 100 in conjunction with the testing device 500 may measure characteristics of the N number of devices to determine failure.

In particular, measuring characteristics of the N number of devices may include measuring currents at the gate, the source, and/or the drain of the power semiconductor devices 10 and/or may include measuring voltage at the gate, the source, and/or the drain of the power semiconductor devices 10.

In one aspect; measuring a drain leakage on a drain of the power semiconductor devices 10 may indicate a device failure. In one aspect; measuring an increase in a drain leakage on a drain of the power semiconductor devices 10 may indicate a device failure. In one aspect, measuring an increase in a drain leakage above a particular threshold on a drain of the power semiconductor devices 10 may indicate a device failure.

In one aspect, measuring a current on a drain of the power semiconductor devices 10 may indicate a device failure. In one aspect, measuring an increase in a current on a drain of the power semiconductor devices 10 may indicate a device failure. In one aspect, measuring a sudden increase in a current on a drain of the power semiconductor devices 10 may indicate a device failure. Other types of measured characteristics may determine failures as well and are contemplated by the disclosure.

The testing process 100 of FIG. 1 may include monitoring a testing time of the testing process. Once it is determined that one of the power semiconductor devices 10 indicates a device failure, the testing time for that particular one of the power semiconductor devices 10 that indicates a device failure is captured along with the identification of the particular failed one of the power semiconductor devices 10, the various applied values of gate bias voltage (Vgs), drain voltage (Vds), and/or the like for the particular one the power semiconductor devices 10.

The testing process 100 of FIG. 1 may include determining a lifetime prediction as illustrated in box 110. In particular, box 110 of the testing process 100 may be implemented with a testing device 500 as described in further detail with respect to FIG. 5. However, box 110 may be implemented utilizing other configurations as described herein. In this regard, the testing process 100 in conjunction with the testing device 500 may determine a lifetime prediction.

In this regard, the various applied values of gate bias voltage (Vgs), drain voltage (Vds), and/or the like provided to the power semiconductor devices 10, the testing time, as well as the various measured values of current and voltage of the power semiconductor devices 10 may be utilized to determine a lifetime prediction. In particular, fields may be calibrated for the power semiconductor devices 10 to determine an effective drain bias. Thereafter, an extrapolation can be computed to determine a lifetime prediction of the power semiconductor devices 10 based on the various applied values of gate bias voltage (Vgs), drain voltage (Vds), and/or the like to the power semiconductor devices 10, the testing time, as well as the various measured values of current and voltage of the power semiconductor devices 10. In particular, an extrapolation can be computed to lower drain voltage (Vds) values of the power semiconductor devices 10 and Vgs=0V of the power semiconductor devices 10 for a device lifetime prediction during operation at a given use drain voltage (Vds) for the power semiconductor devices 10.

Additionally, the various device failure information of each of the power semiconductor devices 10 may be utilized to determine a time to device failure of each of the power semiconductor devices 10. The time to device failure of each of the power semiconductor devices 10 may be output to an output device such as a display, a printer, a database, an analysis system, or the like. Finally, the various device failure information of each of the power semiconductor devices 10 may be utilized to determine a mean time to failure (MTTF) of each of the power semiconductor devices 10. The MTTF of each of the power semiconductor devices 10 may be output to an output device such as a display, a printer, a database, an analysis system, or the like.

The testing process 100 may alternatively and/or further utilize artificial intelligence and/or machine learning to determine a device lifetime based on the various applied values of gate bias voltage (Vgs), drain voltage (Vds), and/or the like to the power semiconductor devices 10, the testing time, as well as the various measured values of current and voltage of the power semiconductor devices 10. The artificial intelligence and/or machine learning may utilize any number of approaches including one or more of cybernetics and brain simulation, symbolic, cognitive simulation, logic-based, anti-logic, knowledge-based, sub-symbolic, embodied intelligence, computational intelligence and soft computing, machine learning and statistics, and the like.

Figure 2:
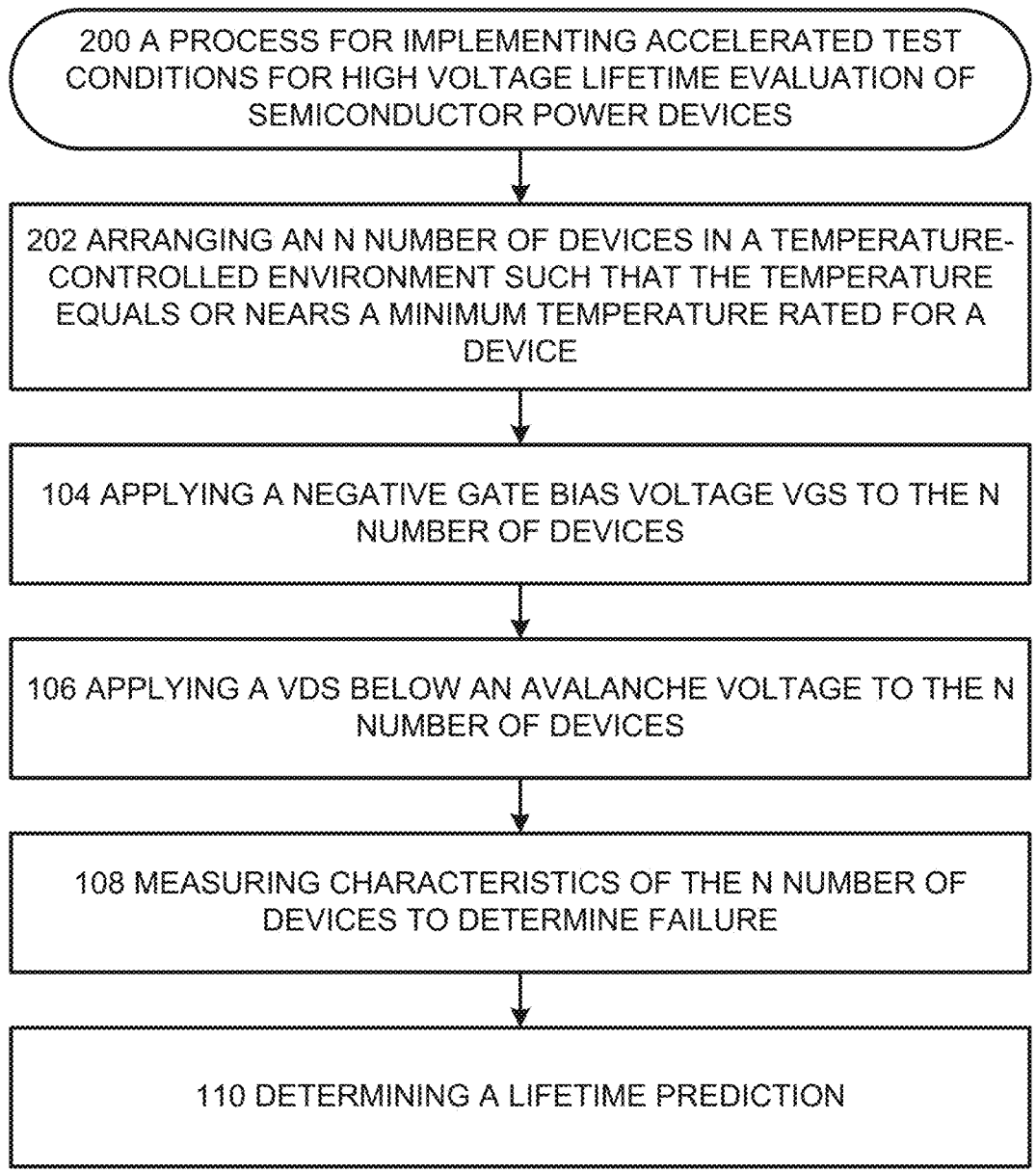
FIG. 2 illustrates a process for implementing accelerated test conditions for high voltage lifetime evaluation of semiconductor power devices according to the disclosure.

FIG. 2 illustrates a process for implementing accelerated test conditions for high voltage lifetime evaluation of semiconductor power devices according to the disclosure.

In particular, FIG. 2 illustrates a testing process 200 for implementing accelerated test conditions for high voltage lifetime evaluation of semiconductor power devices. It should be noted that the testing process 200 is merely exemplary and may be modified consistent with the various aspects disclosed herein. In particular, the testing process 200 may be performed in a different order consistent with the aspects described herein. Moreover, the testing process 200 may be modified to have more or fewer processes consistent with the various aspects disclosed herein. In this regard, the testing process 200 may include the processes illustrated in box 104, box 106, box 108, and box 110 illustrated in FIG. 1 and described above.

Additionally, the testing process 200 of FIG. 2 may include arranging an N number of devices in a temperature-controlled environment such that the temperature equals or nears a minimum rated temperature, a minimum testable temperature, and/or a typical low device temperature for the devices as illustrated in box 202.

In particular, box 202 of the testing process 100 may be implemented with a testing device 500 as described in further detail with respect to FIG. 5. However, box 202 may be implemented utilizing other configurations. In this regard, the testing process 200 in conjunction with the testing device 500 may provide a temperature-controlled environment such that the temperature equals or nears a minimum rated temperature, a minimum testable temperature, and/or a typical low device temperature. In this regard, the temperature may be slightly lower or slightly higher. The temperature-controlled environment may be provided by a temperature-controlled environment system 502 illustrated in FIG. 5 and described below.

Figure 3:
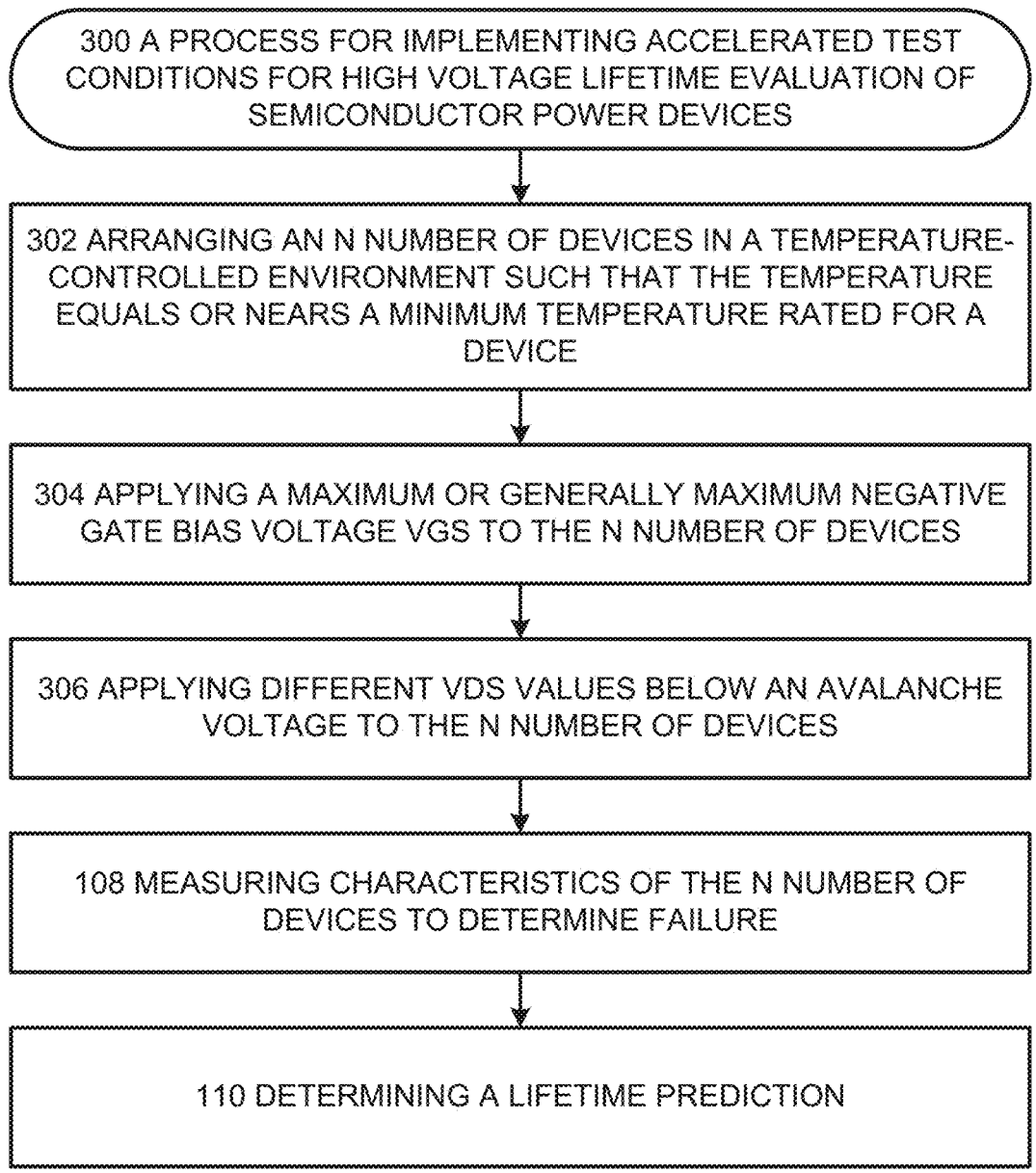
FIG. 3 illustrates a process for implementing accelerated test conditions for high voltage lifetime evaluation of semiconductor power devices according to the disclosure.

FIG. 3 illustrates a process for implementing accelerated test conditions for high voltage lifetime evaluation of semiconductor power devices according to the disclosure.

In particular, FIG. 3 illustrates a testing process 300 for implementing accelerated test conditions for high voltage lifetime evaluation of semiconductor power devices. It should be noted that the testing process 300 is merely exemplary and may be modified consistent with the various aspects disclosed herein. In particular, the testing process 300 may be performed in a different order consistent with the aspects described herein. Moreover, the testing process 300 may be modified to have more or fewer processes consistent with the various aspects disclosed herein. In this regard, the testing process 300 may include the processes illustrated in box 108 and box 110 illustrated in FIG. 1 and described above.

Additionally, the testing process 300 of FIG. 3 may include arranging an N number of devices in a temperature-controlled environment such that the temperature equals or nears a minimum rated temperature, a minimum testable temperature, and/or a typical low device temperature for the devices as illustrated in box 302. In this regard, the temperature may be slightly lower or slightly higher.

In particular, box 302 of the testing process 300 may be implemented with a testing device 500 as described in further detail with respect to FIG. 5. However, box 302 may be implemented utilizing other configurations. In this regard, the testing process 300 in conjunction with the testing device 500 may provide a temperature-controlled environment such that the temperature equals or nears a minimum rated temperature, a minimum testable temperature, and/or a typical low device temperature. The temperature-controlled environment may be provided by a temperature-controlled environment system 502 illustrated in FIG. 5 and described below.

The testing process 300 of FIG. 3 may include applying a negative gate bias voltage (Vgs) to the N number of devices as illustrated in box 304. In particular, box 304 of the testing process 300 may be implemented with a testing device 500 as described in further detail with respect to FIG. 5. However, box 304 may be implemented utilizing other configurations as described herein. In this regard, the testing process 300 in conjunction with the testing device 500 may apply a negative gate bias voltage (Vgs) to the N number of devices as illustrated in box 304. In particular, the testing process 300 may apply a maximum or near maximum negative gate bias voltage (Vgs) to the N number of devices.

The maximum negative gate bias voltage (Vgs) applied to the N number of devices may include a negative gate bias voltage (Vgs) of 80% to 100% of a device rated Vgs, a negative gate bias voltage (Vgs) of 80% to 85% of a device rated Vgs, a negative gate bias voltage (Vgs) of 85% to 90% of a device rated Vgs, a negative gate bias voltage (Vgs) of 90% to 95% of a device rated Vgs, and/or a negative gate bias voltage (Vgs) of 95% to 100% of a device rated Vgs.

The testing process 300 of FIG. 3 may include applying a drain voltage (Vds) below an avalanche voltage to the N number of devices as illustrated in box 306. In particular, box 306 of the testing process 300 may be implemented with a testing device 500 as described in further detail with respect to FIG. 5. However, box 306 may be implemented utilizing other configurations as described herein. In this regard, the testing process 300 in conjunction with the testing device 500 may apply a drain voltage (Vds) below an avalanche voltage to the N number of devices as illustrated in box 306. In particular, the drain voltage (Vds) may be 0% to 100% of the avalanche voltage, 0% to 20% of the avalanche voltage, 20% to 40% of the avalanche voltage, 40% to 60% of the avalanche voltage, 60% to 80% of the avalanche voltage, or 80% to 100% of the avalanche voltage.

In one aspect, the N number of devices may be 2 devices-20 devices, 2 devices-4 devices, 4 devices-6 devices, 6 devices-10 devices, 10 devices-14 devices, or 14 devices-20 devices. In one aspect, P different drain voltage (Vds) levels may be 2 levels-20 levels, 2 levels-4 levels, 4 levels-6 levels, 6 levels-10 levels, 10 levels-14 levels, or 14 levels-20 levels.

In one exemplary aspect, the P different drain voltage (Vds) levels may be 3 different drain voltage (Vds) levels that are near 0V, 48% of Vavalanche, and 96% of Vavalanche. In one exemplary aspect, the P different drain voltage (Vds) levels may be 3 different drain voltage (Vds) levels that include 0V, 48% of Vavalanche, and 96% of Vavalanche.

Figure 4:
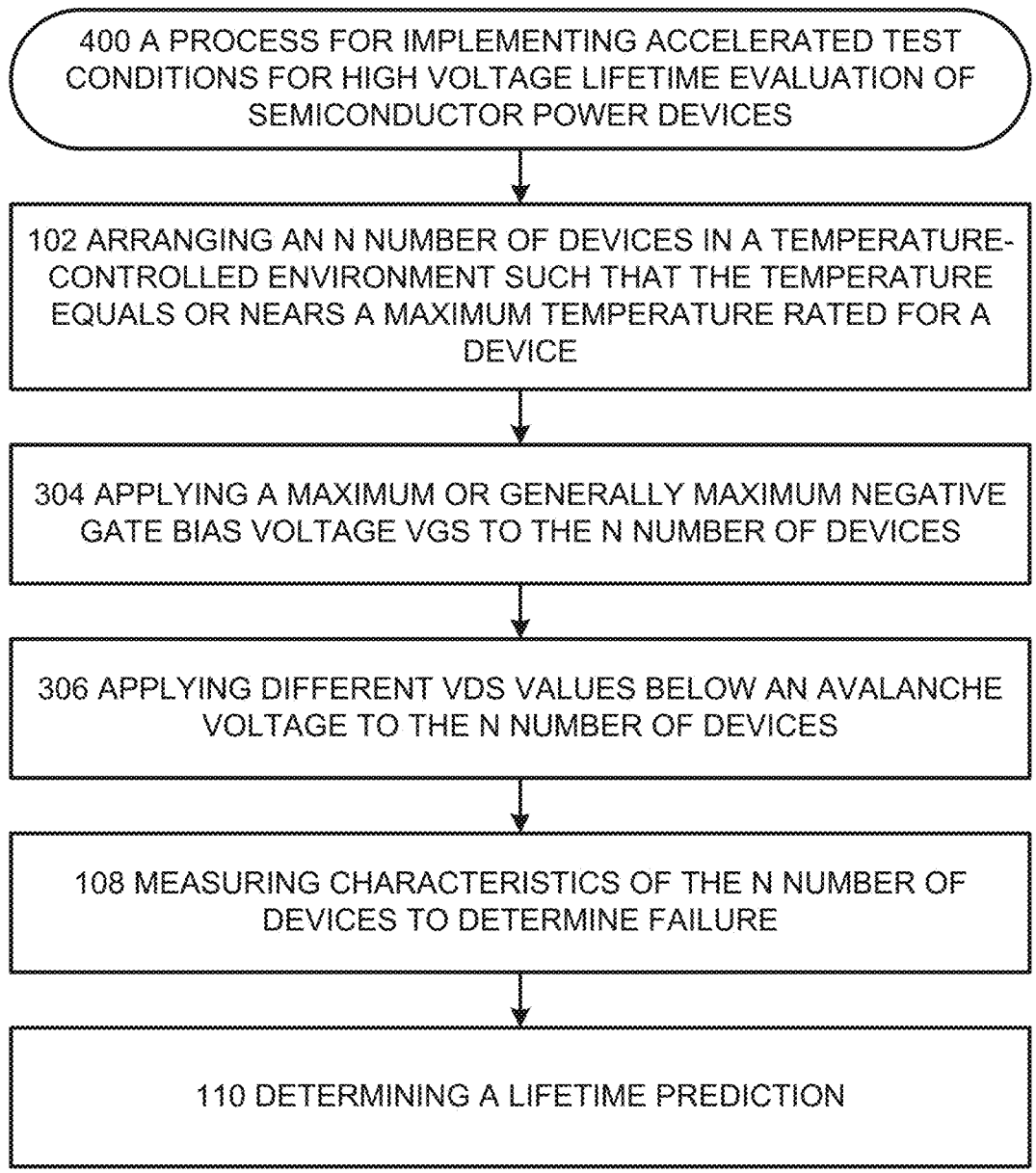
FIG. 4 illustrates a process for implementing accelerated test conditions for high voltage lifetime evaluation of semiconductor power devices according to the disclosure.

FIG. 4 illustrates a process for implementing accelerated test conditions for high voltage lifetime evaluation of semiconductor power devices according to the disclosure.

In particular, FIG. 4 illustrates a testing process 400 for implementing accelerated test conditions for high voltage lifetime evaluation of semiconductor power devices. It should be noted that the testing process 400 is merely exemplary and may be modified consistent with the various aspects disclosed herein. In particular, the testing process 400 may be performed in a different order consistent with the aspects described herein. Moreover, the testing process 400 may be modified to have more or fewer processes consistent with the various aspects disclosed herein. In this regard, the testing process 400 may include the processes illustrated in box 102, box 108, and box 110 illustrated in FIG. 1 and described above; and the testing process 400 may include the processes illustrated in box 304 and box 306 illustrated in FIG. 3 and described above.

In some aspects, only one of the testing process 100, the testing process 200, the testing process 300, and/or the testing process 400 may be utilized. In some aspects, a combination of two or more of the testing process 100, the testing process 200, the testing process 300, and/or the testing process 400 may be utilized. In some aspects, the testing process 100, the testing process 200, the testing process 300, and the testing process 400 may all be utilized.

In particular, a combination of two or more of the testing process 100, the testing process 200, the testing process 300, and/or the testing process 400 may be utilized to separate oxide and semiconductor failure mechanisms, and demonstrate device weaknesses more readily. More specifically, failures determined by the testing process 100 and the testing process 400 that include application of maximum temperature may indicate a gate oxide region failure; and failures determined by the testing process 200 and the testing process 300 that include application of minimum temperature may indicate a failure that relate to a voltage termination on an edge of the device where a field is blocked.

In this regard, the testing process 100, the testing process 200, the testing process 300, and/or the testing process 400, implement accelerated test conditions for high voltage lifetime evaluation of semiconductor power devices that greatly reduces the amount of time needed to obtain desired data for lifetime determination of semiconductor power devices.

By applying a negative gate bias voltage (Vgs) to the power semiconductor devices 10, the fields of the power semiconductor devices 10 will be higher than possible for typical test conditions. Accordingly, the testing process 100, the testing process 200, the testing process 300, and/or the testing process 400, reduces failure time of the power semiconductor devices 10. In particular, the testing process 100, the testing process 200, the testing process 300, and/or the testing process 400, allow test time to be reduced by many hundreds or thousands of hours, as a result of the higher fields provided by the disclosed testing processes.

In this regard, prior art testing processes that do not utilize application of a negative gate bias voltage (Vgs) to power semiconductor devices require 10,000 hours or more when utilizing a first level of stress voltage Vds in order to achieve a first predetermined confidence level of statistical failure data. For example, prior art testing processes that do not utilize application of a negative gate bias voltage (Vgs) to power semiconductor devices, such as silicon carbide MOSFETs, require 10,000 hours or more when utilizing a first level of stress voltage Vds in order to achieve a first predetermined confidence level of statistical failure data.

The disclosed application of a negative gate bias voltage (Vgs) to the power semiconductor when utilizing a first level of stress voltage Vds can achieve a first predetermined confidence level of statistical failure data in 3000 hours to 9000 hours, 3000 hours to 4000 hours, 4000 hours to 5000 hours, 5000 hours to 6000 hours, 6000 hours to 7000 hours, 7000 hours to 8000 hours, or 8000 hours to 9000 hours. In particular, the disclosed application of a negative gate bias voltage (Vgs) to the power semiconductor devices when utilizing a first level of stress voltage Vds can achieve a first predetermined confidence level of statistical failure data in less than 3000, less than 4000 hours, less than 5000 hours, less than 6000 hours, less than 7000 hours, less than 8000 hours, or less than 9000 hours.

For example, the disclosed application of a negative gate bias voltage (Vgs) to the power semiconductor devices, such as silicon carbide MOSFETs, when utilizing a first level of stress voltage Vds can achieve a first predetermined confidence level of statistical failure data in 3000 hours to 9000 hours, 3000 hours to 4000 hours, 4000 hours to 5000 hours, 5000 hours to 6000 hours, 6000 hours to 7000 hours, 7000 hours to 8000 hours, or 8000 hours to 9000 hours. In particular, the disclosed application of a negative gate bias voltage (Vgs) to the power semiconductor devices, such as silicon carbide MOSFETs, when utilizing a first level of stress voltage Vds can achieve a first predetermined confidence level of statistical failure data in less than 3000, less than 4000 hours, less than 5000 hours, less than 6000 hours, less than 7000 hours, less than 8000 hours, or less than 9000 hours.

Additionally, prior art testing processes that do not utilize application of a negative gate bias voltage (Vgs) to power semiconductor devices require 2,500 hours or more when utilizing a second level of stress voltage Vds in order to achieve a second predetermined confidence level of statistical failure data. For example, prior art testing processes that do not utilize application of a negative gate bias voltage (Vgs) to power semiconductor devices, such as silicon carbide MOSFETs, require 2,500 hours or more when utilizing a second level of stress voltage Vds in order to achieve a second predetermined confidence level of statistical failure data.

The disclosed application of a negative gate bias voltage (Vgs) to the power semiconductor when utilizing a second level of stress voltage Vds can achieve a second predetermined confidence level of statistical failure data in 500 hours to 2000 hours, 500 hours to 800 hours, 800 hours to 1000 hours, 1000 hours to 1400 hours, 1400 hours to 1800 hours, 1800 hours to 2000 hours. In particular, the disclosed application of a negative gate bias voltage (Vgs) to the power semiconductor devices when utilizing a second level of stress voltage Vds can achieve a second predetermined confidence level of statistical failure data in less than 500, less than 800 hours, less than 1000 hours, less than 1400 hours, less than 1800 hours, or less than 2000 hours.

For example, the disclosed application of a negative gate bias voltage (Vgs) to the power semiconductor devices, such as silicon carbide MOSFETs, when utilizing a second level of stress voltage Vds can achieve a second predetermined confidence level of statistical failure data in 500 hours to 2000 hours, 500 hours to 800 hours, 800 hours to 1000 hours, 1000 hours to 1400 hours, 1400 hours to 1800 hours, 1800 hours to 2000 hours. In particular, the disclosed application of a negative gate bias voltage (Vgs) to the power semiconductor devices, such as silicon carbide MOSFETs, when utilizing a second level of stress voltage Vds can achieve a second predetermined confidence level of statistical failure data in less than 500, less than 800 hours, less than 1000 hours, less than 1400 hours, less than 1800 hours, or less than 2000 hours.

In various aspects, the second level of stress voltage Vds is greater than the first level of stress voltage Vds. In various aspects, the second predetermined confidence level of statistical failure data is less than the first predetermined confidence level of statistical failure data. Furthermore, implementing other levels of stress voltage Vds and other confidence levels of statistical failure data may achieve similar reductions in testing time. Accordingly, the testing process 100, the testing process 200, the testing process 300, and/or the testing process 400, reduces test time by 30% to 80% in comparison to prior art test processes, reduces test time by 30% to 40% in comparison to prior art test processes, reduces test time by 40% to 45% in comparison to prior art test processes, reduces test time by 45% to 55% in comparison to prior art test processes, reduces test time by 55% to 65% in comparison to prior art test processes, or reduces test time by 65% to 80% in comparison to prior art test processes.

In one aspect, the testing process 100, the testing process 200, the testing process 300, and/or the testing process 400, are 2 times faster to 5 times faster in comparison to prior art test processes, 2 times faster to 3 times faster in comparison to prior art test processes, 3 times faster to 4 times faster in comparison to prior art test processes, or 4 times faster to 5 times faster in comparison to prior art test processes.

The testing process 100, the testing process 200, the testing process 300, and/or the testing process 400 implement test conditions such that a lifetime can be determined with far less testing time. Thus, the time for new device evaluation can be significantly shortened.

In particular, the testing process 100, the testing process 200, the testing process 300, and/or the testing process 400 implement test conditions that allow failure times to be reduced by at least two factors. First, a negative gate bias voltage (Vgs) (or field) is applied during the test to increase the electric field in the critical regions of the device. This results in providing higher field and faster failure rates. Second, both low temperature and high temperature conditions are tested. In this regard, the temperature effects help to isolate the effects of the gate field and the semiconductor field on the failure, revealing the failure mechanism. For example, failure mechanisms such as gate oxide failure, semiconductor-related failure, and/or the like.

FIG. 5 illustrates an exemplary testing device that may be utilized at least in part for the processes according to the disclosure.

In particular, FIG. 5 illustrates a testing device 500 for use with various aspects of the disclosure. The testing device 500 may be implemented as a lifetime testing apparatus, a mechanical probe station, a curve tracer implemented with curve tracer functionality; and the like. The testing device 500 may be used to physically acquire signals from the internal nodes of the device. The testing device 500 may be implemented as a single device for simultaneously testing the N number of power semiconductor devices 10. Alternatively, a plurality of the testing device 500 may be implemented to each test a plurality of power semiconductor devices 10. Alternatively, an N number of the testing device 500 may be implemented to each test one of the N number of power semiconductor devices 10.

The testing device 500 may be implemented, may be controlled; may control, and the like in conjunction with other dedicated hardware 510 as defined herein. The testing device 500 may be implemented, may be controlled, may control, and the like in conjunction with other computing devices 520 as defined herein.

The testing device 500 may utilize connectors, manipulators, or the like, which may allow a connection to the power semiconductor devices 10. In one aspect, the connectors and/or manipulators may include the connectors implemented as needles that may be positioned in relation to the power semiconductor devices 10 for capturing voltages, currents, and/or the like, to a gate, a source, and/or a drain. Moreover, the connectors and/or manipulators may be positioned in relation to the power semiconductor devices 10 for applying voltages, currents, and/or the like to the gate, the source, and/or the drain of the power semiconductor devices 10.

The testing device 500 may include a processor 552, a temperature-controlled environment system 502, a power supply 554, a memory 556, a display 568, a read-only memory 572, an input device 564, an input/output device 562, an analog-to-digital converter 560, a digital to analog converter 570, a clock 558, one or more sensors 592, a power source 594, and the like.

The processor 552 may be configured to process at least in part test processes, test functions, provide other test services, implement the testing process 100, implement the testing process 200, implement the testing process 300, implement the testing process 400, and/or the like. In one aspect, the testing device 500 may be implemented as a source measure unit (SMU), which may be capable of both sourcing input to the device and measuring output from the device.

The temperature-controlled environment system 502 may be a device or system to provide desired temperature-controlled environment for testing of the power semiconductor devices 10. The temperature-controlled environment system 502 may include a heating device, a heating device controller, a cooling device, a cooling device controller, a temperature sensor, and the like.

The heating device controller may be responsive to the temperature sensor to control the heating device to provide an elevated temperature environment for testing the power semiconductor devices 10. The temperature-controlled environment system 502 may be implemented to provide a controlled maximum or near maximum rated device temperature for the power semiconductor devices 10.

The cooling device controller may be responsive to the temperature sensor to control the cooling device to provide a low temperature environment for testing the power semiconductor devices 10. The temperature-controlled environment system 502 may be implemented to provide a controlled minimumated device temperature for the power semiconductor devices 10.

The power source 594 may be configured as a highly stable DC power source, a constant current source, a constant voltage source, a variable current source, a variable voltage source, and/or the like. The power source 594 may be configured for applying voltages, currents, and/or the like to the gate, the source, and/or the drain of the power semiconductor devices 10.

The one or more sensors 592 may measure various device characteristics. In particular, one or more sensors 592 may be implemented as one or more temperature sensors to measure a temperature of the power semiconductor devices 10, measure a temperature of the temperature-controlled environment system 502, and/or the like. The one or more temperature sensors may be implemented as a Negative Temperature Coefficient (NTC) thermistor, a Resistance Temperature Detector (RTD), a thermocouple, a semiconductor-based sensor, and/or the like.

The one or more sensors 592 may include one or more current sensors, one or more voltage sensors, and the like. The one or more current sensors may be configured for measuring currents at the gate, the source, and/or the drain of the power semiconductor devices 10. The one or more voltage sensors may be configured for measuring voltage at the gate, the source, and/or the drain of the power semiconductor devices 10.

The testing device 500 may implement instrument integration, communication, test protocols, test time, and/or the like by utilizing an on-board script processor. The testing device 500 may allow user-defined on-board script execution for controlling test sequencing, test flow, decision making, instrument autonomy, implementation of the testing process 100, the testing process 200, the testing process 300, the testing process 400, and/or the like. The testing device 500 may include contact check functionality to verify good connections to the power semiconductor devices 10 under test before the test begins.

Additionally, the testing device 500 may implement an operating system, a touchscreen controller, a communications component, a graphics component, a contact/motion component, and the like to provide full functionality. In particular, the processor 552 may be configured to execute a software application configured to control the testing device 500 such as the testing process 100, the testing process 200, the testing process 300, and/or the testing process 400, as described herein.

In one aspect, the software application may be configured to interact with the one or more sensors 592 and the like as described herein. In particular, the one or more sensors 592 may provide signals to the processor 552.

The testing device 500 may implement a testing protocol that may include the testing process 100, the testing process 200, the testing process 300, and/or the testing process 400. The testing protocol may determine particular voltage levels, current amounts, time periods, and the like for the test delivery to the power semiconductor devices 10. The testing device 500 may be configured to utilize outputs from the one or more sensors 592 to adjust the current, voltage, and/or the like provided by power source 594 to the power semiconductor devices 10 in conjunction with the testing process 100, the testing process 200, the testing process 300, and/or the testing process 400.

The testing device 500, the dedicated hardware 510, and/or the computing devices 520 may determine device failure information of each of the power semiconductor devices 10 and may output various device failure information of each of the power semiconductor devices 10 to an output device such as a display, a printer, a database, an analysis system, or the like. In one aspect, the testing device 500, the dedicated hardware 510, and/or the computing devices 520 may determine device failure information of each of the power semiconductor devices 10 and may store various device failure information of each of the power semiconductor devices 10 to the memory 556, another memory device, a database, or the like. Additionally, the various device failure information of each of the power semiconductor devices 10 may be utilized by the testing device 500, the dedicated hardware 510, and/or the computing devices 520 to determine a time to device failure of each of the power semiconductor devices 10. The time to device failure of each of the power semiconductor devices 10 may be output to an output device such as a display, a printer, a database, an analysis system, or the like. Finally, the various device failure information of each of the power semiconductor devices 10 may be utilized by the testing device 500, the dedicated hardware 510, and/or the computing devices 520 to determine a mean time to failure (MTTF) of each of the power semiconductor devices 10. The MTTF of each of the power semiconductor devices 10 may be output to an output device such as a display, a printer, a database, an analysis system, or the like.

The testing process 100, the testing process 200, the testing process 300, and/or the testing process 400 of the disclosure may be implemented in a number of different types or implementations of a power semiconductor devices 10. In particular, the power semiconductor devices 10 may be implemented as a vertical semiconductor power transistor, a metal-oxide-semiconductor field-effect transistor (MOSFET), an insulated-gate bipolar transistor (IGBT), a junction gate field-effect transistor (JFET), a vertical Gallium nitride (GaN) based transistor device, a silicon carbide (SiC) based transistor, a silicon (Si) based transistor, related power devices with gate control, and/or the like.

Figure 10:
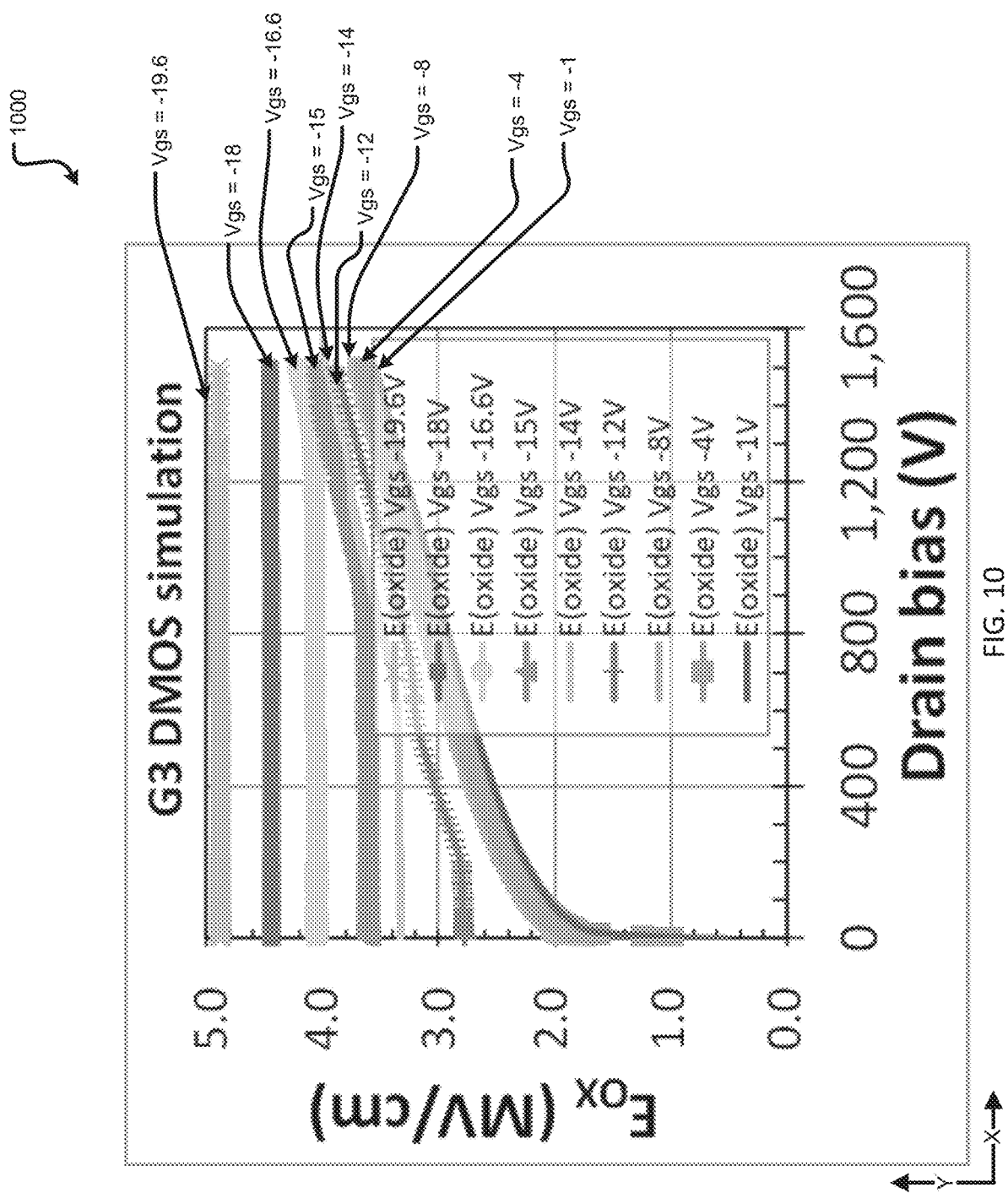
FIG. 10 illustrates a graph of DMOS (double-diffused MOSFET) simulation according to the disclosure.
Figure 11:
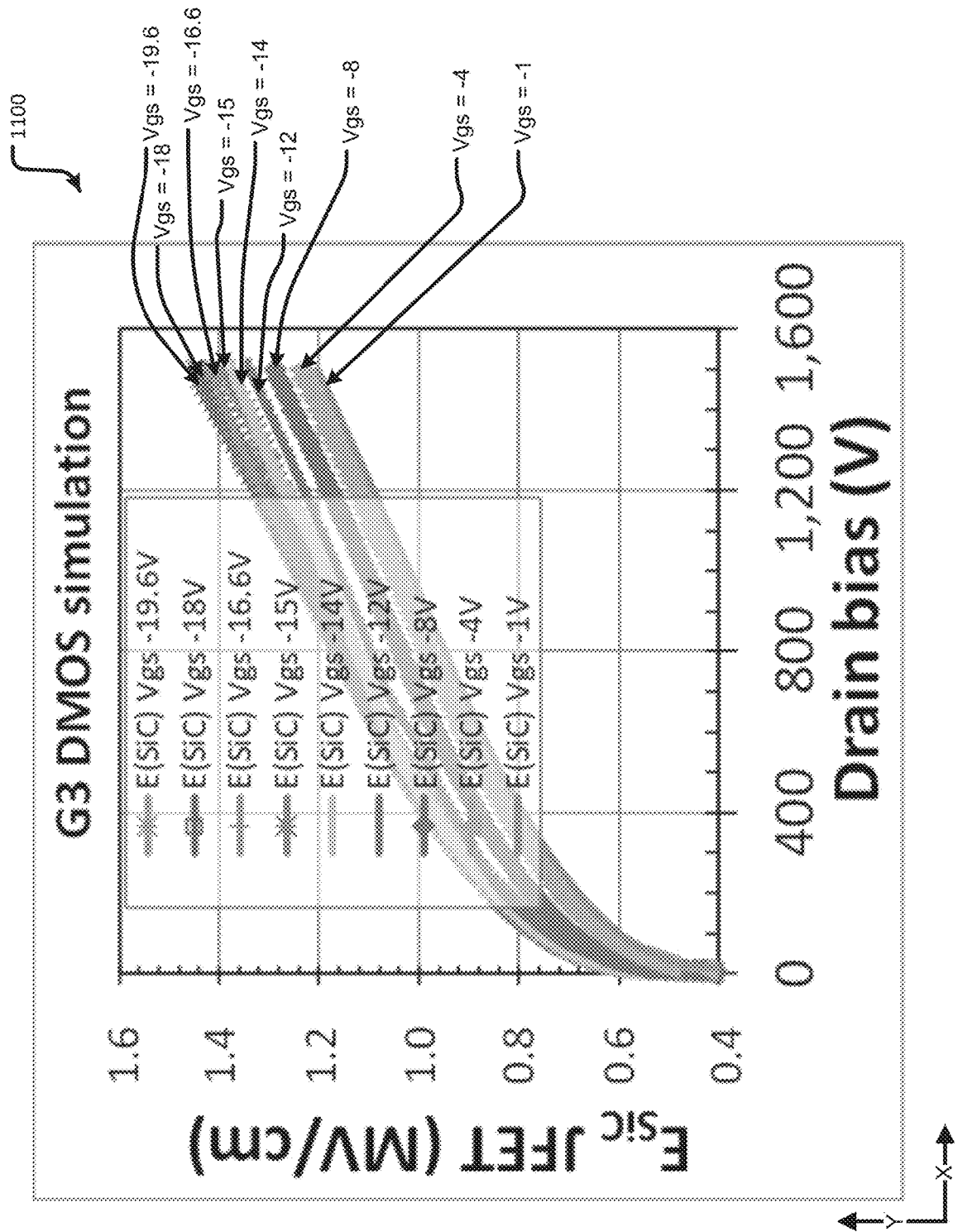
FIG. 11 illustrates a graph of DMOS (double-diffused MOSFET) simulation according to the disclosure.

As further described below, FIG. 6, FIG. 7, FIG. 8, FIG. 9, FIG. 10, and/or FIG. 11 provide specific exemplary background, support, and information for implementations of the system and process of the disclosure.

Figure 6:
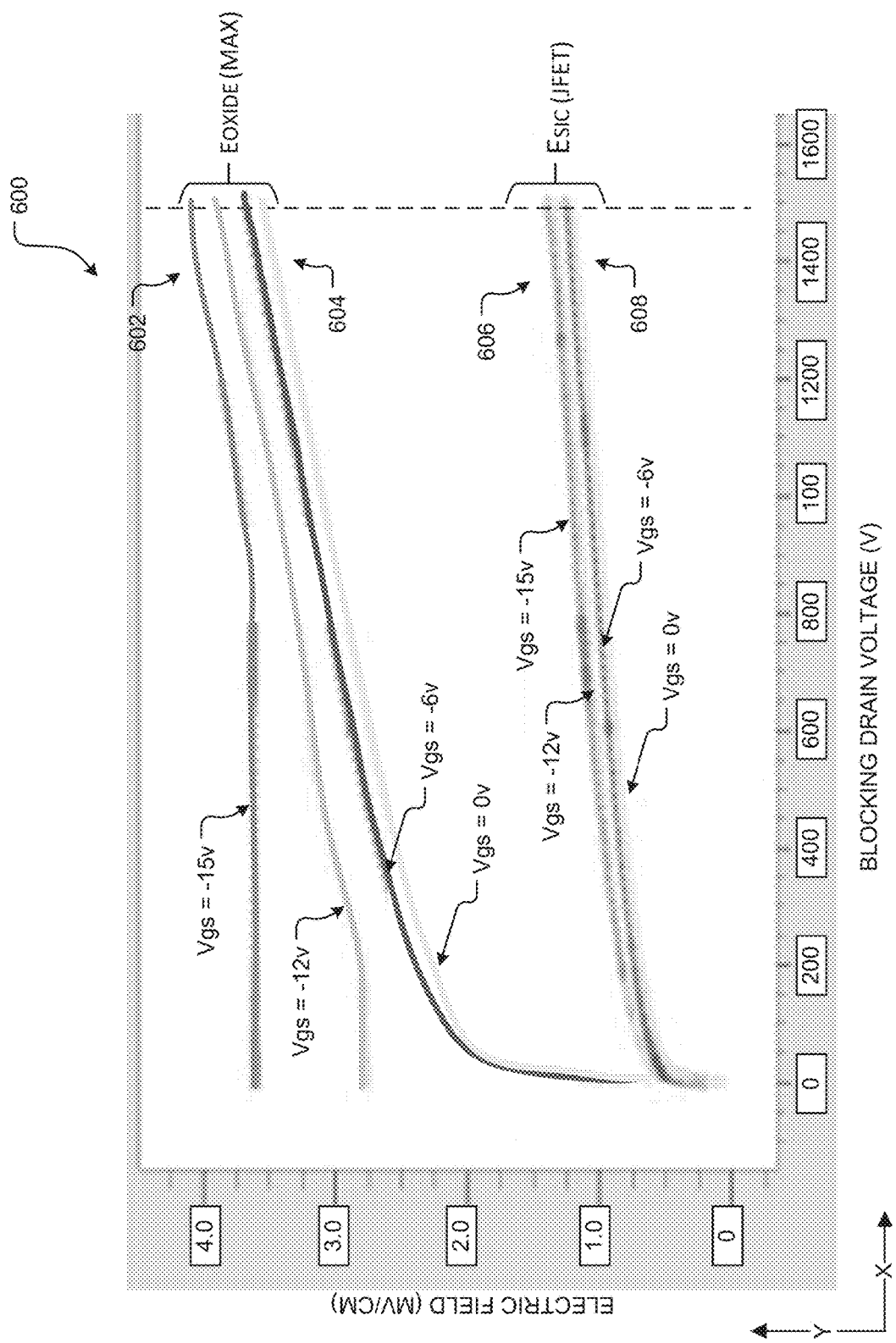
FIG. 6 illustrates a graph showing the effects of a negative gate bias voltage (Vgs) according to aspects of the disclosure.

FIG. 6 illustrates a graph showing the effects of a negative gate bias voltage (Vgs) according to aspects of the disclosure.

In particular, FIG. 6 illustrates a graph 600. The vertical axis or y-axis presenting values of electric field in the gate oxide (Eox) in megavolts per centimeter (MV/cm) and further presenting values of the electric field in the SiC (ESIC) in megavolts per centimeter (MV/cm); and the horizontal axis or x-axis presenting values of a blocking drain voltage (v).

Additionally, the graph 600 illustrates four curves of an electric field in the gate oxide (Eox) for transistors having a gate bias voltage (Vgs) at 0V, −6V, −12V, and −15V; and the graph 600 illustrates four curves of an electric field in the SIC (ESIC) for transistors having a gate bias voltage (Vgs) at 0V, −6V, −12V, and −15V.

In this regard, the effects of a negative gate bias voltage (Vgs) are shown by the graph 600, which shows the electric field in the gate oxide (Eox) and the electric field in the SIC (ESIC) just below an oxide (JFET region) in an exemplary vertical MOSFET device as the blocking drain voltage is increased, and under conditions of varied negative gate bias voltage (Vgs) applied.

The graph 600 further shows the simulated electric field in the center of a MOSFET JFET-region (in the gate oxide (Eox) and the electric field in the SIC (ESIC)) where fields near the gate oxide are highest, and where device failure typically occurs due to high-field effects. The field in the gate oxide region (Eox) is seen to be higher than that of the field (ESIC) in the SiC, and with a negative gate bias voltage (Vgs) applied of negative 15V, the oxide field is 16% higher at 1500V Vds (indicated by arrow 602) than without the gate field (0V—indicated by arrow 604). The SiC field is also increased near the surface with the negative gate bias voltage (Vgs) applied (indicated by arrow 606) than without the gate field (DV—indicated by arrow 608).

In the simulation results illustrated by the graph 600, if the exemplary device undergoes an avalanche breakdown just above 1500V (an equilibrium, sustainable event if currents are low enough), then the fields in the device cannot be increased above the 1500V level (as indicated by the dashed vertical line). However, the negative gate bias voltage (Vgs) allows the addition of 16% higher field for this exemplary device, which will result in a faster failure time than for the condition without negative gate bias voltage (Vgs) applied.

In this regard, graph 600 illustrates that: At 1500 drain voltage (Vds), the Electric field strength (Eox) equals 3.5 MV/cm when gate bias voltage (Vgs) equals 0 V. At 1500 drain voltage (Vds), the Electric field strength (Eox) equals 3.88 MV/cm when gate bias voltage (Vgs) equals −12V indicating an increased oxide field by 11%. At 1500 drain voltage (Vds), the Electric field strength (Eox) equals 4.06 MV/cm when gate bias voltage (Vgs) equals −15V indicating an increased oxide field by 16%.

Although the results illustrated in the graph 600 of FIG. 6 are for a particular implementation of a power semiconductor device, similar results are contemplated for other implementations of power semiconductor devices.

Figure 7:
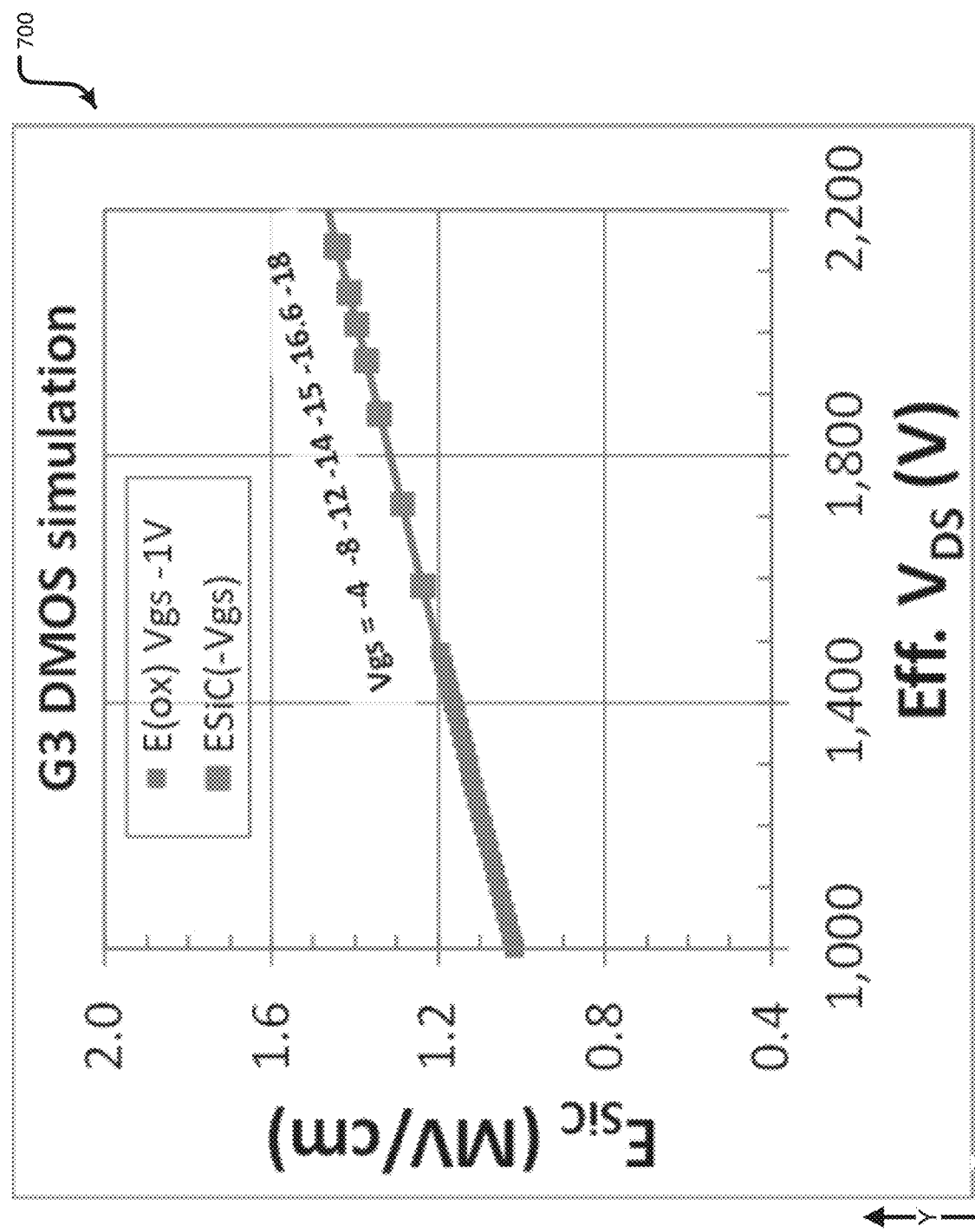
FIG. 7 illustrates a graph showing the effects of a negative gate bias voltage (Vgs) according to aspects of the disclosure.

FIG. 7 illustrates a graph showing the effects of a negative gate bias voltage (Vgs) according to aspects of the disclosure.

In particular, FIG. 7 illustrates a graph 700. The vertical axis or y-axis presenting values of the electric field in the SiC (ESIC) in megavolts per centimeter (MV/cm); and the horizontal axis or x-axis presenting values of an effective drain voltage Vds (v).

Additionally, the graph 700 illustrates seven points for the electric field in the SIC (ESIC) for transistors having a gate bias voltage (Vgs) at −4V, −8V, −12V, −14V, −15V, −16.6V, −18V, and −19.6V in conjunction with the associated effective drain voltage Vds (v).

As illustrated in the graph 700, as a result of the negative bias adding higher field, it is analogous to operating at a higher drain voltage (Vds) bias, which cannot be achieved without a VGS negative bias as described in the disclosure due to the avalanche voltage that occurs around 1500V drain voltage (Vds) for the exemplary device and sets a maximum to the fields in the device at VGS=0V. This higher "effective" drain voltage (Vds) value is shown graphically in FIG. 7 for the field in the SiC JFET region and the graph 700 shows how the "effective" drain voltage (Vds) increases with negative gate bias voltage (Vgs) voltage.

Although the results illustrated in the graph 700 of FIG. 7 are for a particular implementation of a power semiconductor device, similar results are contemplated for other implementations of power semiconductor devices.

Figure 8:
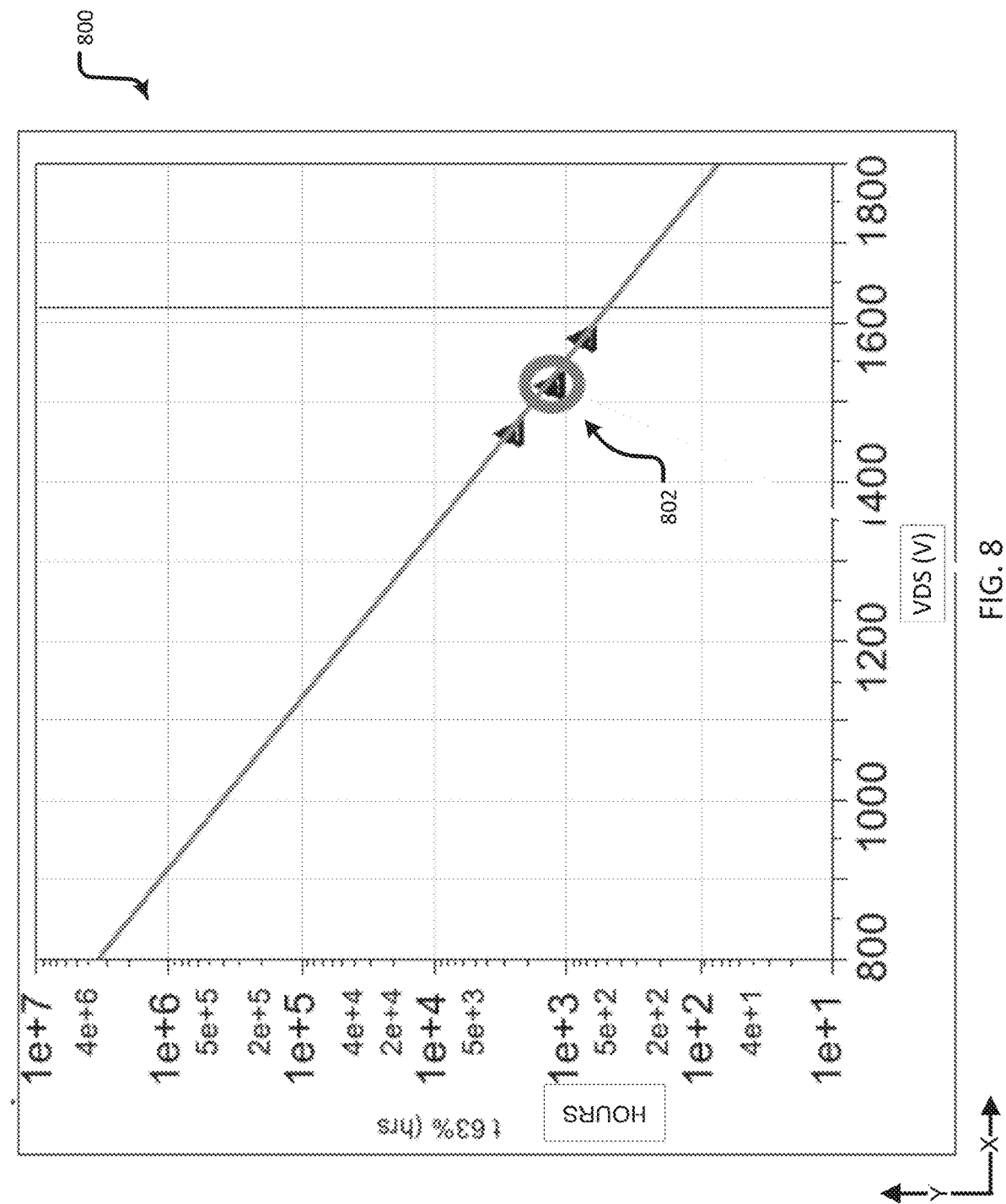
FIG. 8 illustrates standard high temperature reverse bias (HTRB) test data.

FIG. 8 illustrates standard high temperature reverse bias (HTRB) test data.

In particular, FIG. 8 illustrates a graph 800. The vertical axis or y-axis presenting values of the 63% failure time for each condition tested in hours (hrs); and the horizontal axis or x-axis presenting values of the drain voltage Vds (v).

More specifically, FIG. 8 illustrates Standard HTRB test data of a group of exemplary 1200V rated SiC MOSFETs (with drain bias (drain voltage (Vds)) only), plotting the 63% failure time for each condition tested (Vds=1460V, 1520V, and 1580V). The goal is to determine device lifetime at the use voltage (typically ~800 Vds). A test time of at least 3,000 his is needed for this case. The device experiences avalanche breakdown at approximately 1620V and this limits the maximum drain voltage (Vds) acceleration possible for this test. Although the results illustrated in the graph 800 of FIG. 8 are for a particular implementation of a power semiconductor device, similar results are contemplated for other implementations of power semiconductor devices.

Figure 9:
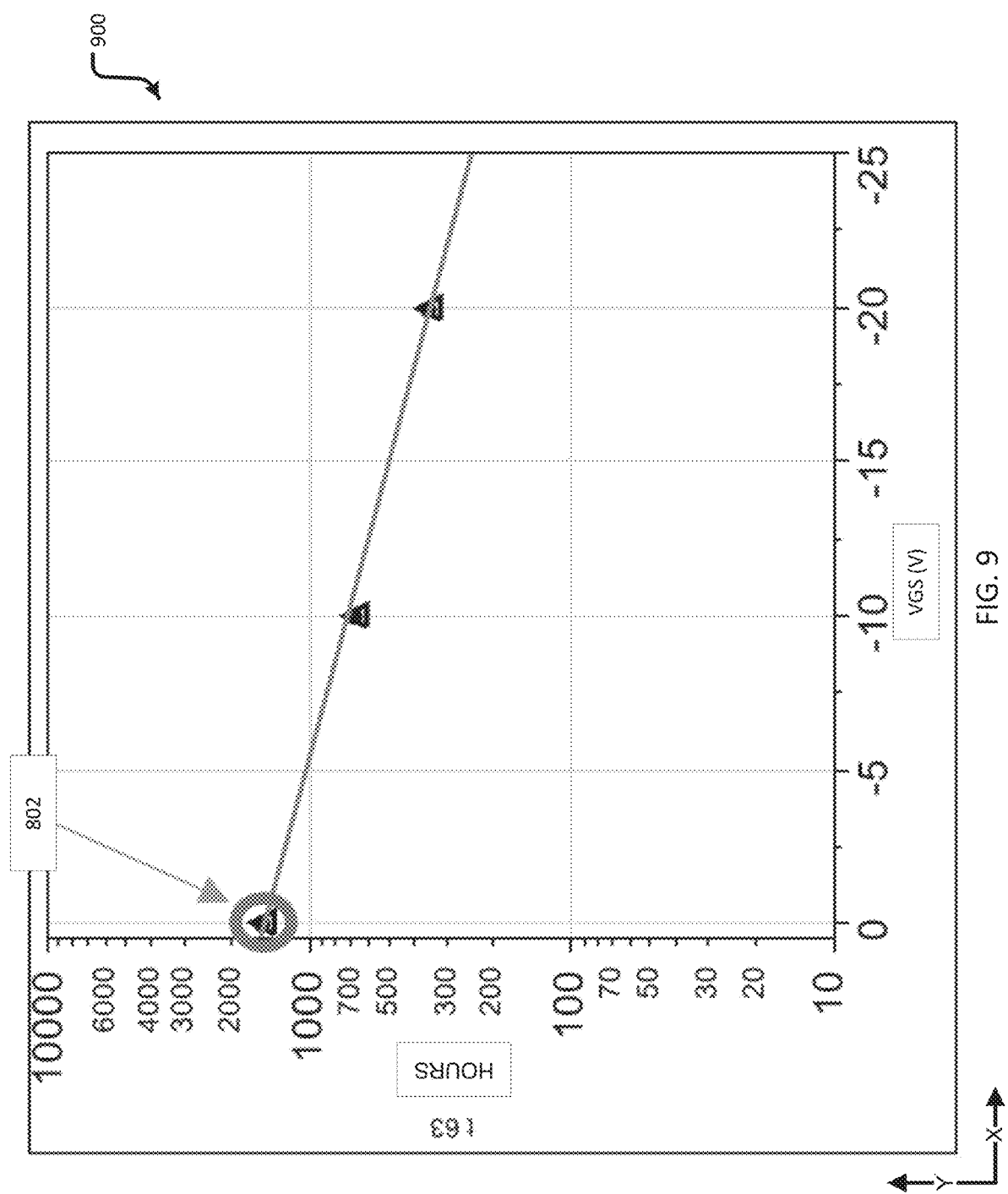
FIG. 9 illustrates results of the disclosed process implementing an accelerated test according to the disclosure.

FIG. 9 illustrates results of the disclosed process implementing an accelerated test according to the disclosure.

In particular, FIG. 9 illustrates a graph 900. The vertical axis or y-axis presenting values of the 63% failure time for each condition tested in hours (hrs); and the horizontal axis or x-axis presenting values of the gate bias voltage (Vgs) (v).

More specifically, FIG. 9 illustrates results of the disclosed process implementing an accelerated test according to the disclosure for the same type of 1200V SiC MOSFET as in FIG. 8, with the drain voltage (Vds) value of 1520V for 3 groups where a middle data point 802 of the graph 800 forms the Vgs=0V point 802 in the graph 900. Here the gate bias voltage (Vgs) is applied to accelerate the field beyond what is possible with a drain voltage (Vds) increase only. Notice that increasing the gate bias voltage (Vgs) increases the field, resulting in about a 4× faster failure at −20 Vgs than at 0 Vgs. This shows the effectiveness of the test to allow faster failure, so the device properties can be more quickly be evaluated. Applying this test with Vds=1580V would result in a fastest acceleration of failure time than 1520 Vds. However, approximately 1620V forms the absolute limit for this particular device due to a semiconductor breakdown (avalanche) that would occur with that drain voltage (Vds); the maximum voltage at Vgs=0V depends on the device type and design. Although the results illustrated in the graph 900 of FIG. 9 are for a particular implementation of a power semiconductor device, similar results are contemplated for other implementations of power semiconductor devices.

FIG. 10 illustrates a graph of DMOS (double-diffused MOSFET) simulation according to the disclosure.

In particular, FIG. 10 illustrates a graph 1000. The vertical axis or y-axis presenting values of values of electric field in the gate oxide (Eox) in megavolts per centimeter (MV/cm) and the horizontal axis or x-axis presenting values voltage drain bias in volts (v).

FIG. 11 illustrates a graph of DMOS (double-diffused MOSFET) simulation according to the disclosure.

In particular, FIG. 11 illustrates a graph 1100. The vertical axis or y-axis presenting values of the electric field in the SiC (ESIC) in megavolts per centimeter (MV/cm) and the horizontal axis or x-axis presenting values voltage drain bias in volts (v).

As illustrated in FIG. 10 the graph 1000 shows the field in the gate oxide and as illustrated in FIG. 11 the graph 1100 shows the field in the SiC just below the gate oxide, with the effect of the negative gate oxide voltage raising the field in each region as shown.

Although the results illustrated in the graph 1000 and FIG. 10 and the graph 1100 of FIG. 11 are for a particular implementation of a power semiconductor device, similar results are contemplated for other implementations of power semiconductor devices.

Reiterating, based on avalanche breakdown in a drift region at the device P/N interface near a top of the device, there is a maximum field that can be applied by drain voltage (Vds) bias alone. However, because the gate region (or JFET region between the gate channels) is shielded by a drift P/N boundary, its field is lower there. Accordingly, this is why the negative bias on the gate is effective in accelerating the high temperature reverse bias (HTRB) failure time. If the JFET region of the MOSFET (or IGBT) device were not shielded in this way, there would be no way to further increase the field, and no need for this new measurement approach.

Accordingly, the disclosure has disclosed a system and process for implementing accelerated test conditions for high voltage lifetime evaluation of semiconductor power devices that greatly reduces the amount of time needed to obtain desired data for lifetime determination of semiconductor power devices.

Semiconductor power devices may be implemented in numerous different applications. For example, semiconductor power devices can be implemented in power modules. Power modules are known in various forms. Power modules provide a physical containment for power components, usually power semiconductor devices. These semiconductor power devices are typically arranged on a powerelectronic substrate. The power module typically carries the semiconductor power devices, provides electrical and thermal contact, and includes electrical insulation. As another example, semiconductor power devices can be implemented in a package that may be implemented as a Radio frequency (RF) package, a Radio frequency (RF) amplifier package, a Radio frequency (RF) power amplifier package, a Radio frequency (RF) power transistor package, a Radio frequency (RF) power amplifier transistor package, and/or the like.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Additionally, the various aspects described may be implemented separately. Moreover, one or more the various aspects described may be combined. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical aspects of the disclosure and, although specific terms are employed, they are used in a generic and descriptive sense only and not for purposes of limitation, the scope of the disclosure being set forth in the following claims.

Aspects of the disclosure may be implemented in any type of computing devices, such as, e.g., a desktop computer, personal computer, a laptop/mobile computer, a personal data assistant (PDA), a mobile phone, a tablet computer, cloud computing device, and the like, with wired/wireless communications capabilities via the communication channels.

Further in accordance with various aspects of the disclosure, the methods described herein are intended for operation with dedicated hardware implementations including, but not limited to, PCs, PDAs, semiconductors, application specific integrated circuits (ASIC), programmable logic arrays, cloud computing devices, and other hardware devices constructed to implement the methods described herein.

It should also be noted that the software implementations of the disclosure as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the disclosure is considered to include a tangible storage medium or distribution medium, as listed herein and including art-recognized equivalents and successor media, in which the software implementations herein are stored.

Additionally, the various aspects of the disclosure may be implemented in a non-generic computer implementation. Moreover, the various aspects of the disclosure set forth herein improve the functioning of the system as is apparent from the disclosure hereof. Furthermore, the various aspects of the disclosure involve computer hardware that it specifically programmed to solve the complex problem addressed by the disclosure. Accordingly, the various aspects of the disclosure improve the functioning of the system overall in its specific implementation to perform the process set forth by the disclosure and as defined by the claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

The invention claimed is:

1. A process for testing semiconductor power devices comprising:
   arranging an N number of devices in a temperature-controlled environment such that a temperature of the N number of devices is near one of the following: a maximum temperature rated for the N number of devices and a minimum temperature rated for the N number of devices;
   applying with at least one testing device a negative gate bias voltage (Vgs) to the N number of devices;
   applying with the at least one testing device a drain voltage (Vds) to the N number of devices;
   measuring with the at least one testing device currents and/or device voltages of the N number of devices to generate device test data;
   determining with the at least one testing device a failure of one or more of the N number of devices based on the device test data generated from the device currents and/or the device voltages that are measured by the at least one testing device to generate failure data; and
   outputting with the at least one testing device the failure data for the N number of devices.

2. The process for testing according to claim 1 wherein the applying a negative gate bias voltage (Vgs) to the N number of devices comprises applying one or more different negative gate bias voltages (Vgs) to the N number of devices.

3. The process for testing according to claim 1 wherein the applying with the at least one testing device a drain voltage (Vds) to the N number of devices comprises applying one or more different drain voltage (Vds) voltages to the N number of devices.

4. The process for testing according to claim 1 wherein the measuring with the at least one testing device currents and/or voltages of the N number of devices to generate device test data comprises measuring a current on a drain of each of the N number of devices to determine a device failure.

5. The process for testing according to claim 1 further comprising:
   monitoring a testing time of the N number of devices; and
   capturing the testing time for a particular one of the N number of devices that indicates a device failure along with an identification of the particular failed one of the N number of devices and applied values of the negative gate bias voltage (Vgs) and the drain voltage (Vds).

6. The process for testing according to claim 1 further comprising:
   calibrating fields of the N number of devices to determine an effective drain bias; and
   extrapolating values of the negative gate bias voltage (Vgs), the drain voltage (Vds), and/or a testing time to determine a lifetime prediction of the N number of devices.

7. The process for testing according to claim 1 further comprising determining a mean time to failure (MTTF) of each of the N number of devices based on values of the negative gate bias voltage (Vgs), the drain voltage (Vds), and/or a testing time.

8. The process for testing according to claim 1 wherein a test time is reduced by 30% to 80% based in part on an application of a negative gate bias voltage (Vgs) to the N number of devices.

9. The process for testing according to claim 1 wherein the arranging an N number of devices in a temperature-controlled environment comprises controlling a temperature of the N number of devices to be near a maximum temperature rated for the N number of devices.

10. The process for testing according to claim 1 wherein the arranging an N number of devices in a temperature-controlled environment comprises controlling a temperature of the N number of devices to be near a minimum temperature rated for the N number of devices.

11. The process for testing according to claim 1 wherein the applying a negative gate bias voltage (Vgs) to the N number of devices comprises applying a near maximum negative gate bias voltage (Vgs) to the N number of devices.

12. The process for testing according to claim 1 wherein the applying with the at least one testing device a drain voltage (Vds) to the N number of devices comprises applying a near maximum drain voltage (Vds) voltage to the N number of devices.

13. The process for testing according to claim 1 wherein the measuring with the at least one testing device currents and/or voltages of the N number of devices to generate device test data comprises measuring at least one of the following: currents at a gate of the N number of devices, currents at a source of the N number of devices, currents at a drain, voltage at a gate of the N number of devices, voltage at a source of the N number of devices, and voltage at a drain of the N number of devices.

14. The process for testing according to claim 1 wherein the measuring with the at least one testing device currents and/or voltages of the N number of devices to generate device test data comprises measuring a drain leakage on a drain of each of the N number of devices to determine a device failure.

15. The process for testing according to claim 1 wherein the applying a negative gate bias voltage (Vgs) to each of the N number of devices generates fields in each of the N number of devices that are higher than possible for typical test conditions.

16. The process for testing according to claim 1 wherein a test time is reduced by 30% to 80% in comparison to a test time implemented by prior art test processes.

17. The process for testing according to claim 1 wherein a test time is reduced by 30% to 80% based in part on an application of a negative gate bias voltage (Vgs) to the N number of devices in comparison to a test time implemented by prior art test processes.

18. The process for testing according to claim 1 wherein a test time is 2 times faster to 5 times faster in comparison to a test time implemented by prior art test processes.

19. The process for testing according to claim 1 wherein a test time is 2 times faster to 5 times faster based in part on an application of a negative gate bias voltage (Vgs) to the N number of devices in comparison to a test time implemented by prior art test processes.

20. The process for testing according to claim 1 wherein a test time is 2 times faster to 5 times faster based in part on an application of a negative gate bias voltage (Vgs) to the N number of devices.

21. The process for testing according to claim 1 wherein a test time is less than 9000 hours to achieve a first predetermined confidence level of statistical failure data.

22. The process for testing according to claim 21 wherein a test time is less than 2000 hours to achieve a second predetermined confidence level of statistical failure data, wherein the first predetermined confidence level of statistical failure data is greater than the second predetermined confidence level of statistical failure data.

23. The process for testing according to claim 1 wherein the applying a negative gate bias voltage (Vgs) to the N number of devices increases an electric field in regions of the N number of devices resulting in faster failure rates.

24. The process for testing according to claim 1 wherein the arranging an N number of devices in a temperature-controlled environment isolates effects of a gate field and a semiconductor field to reveal a failure mechanism.

25. A system for testing semiconductor power devices comprising:
   a temperature-controlled environment configured to hold an N number of devices and maintain a temperature of the N number of devices near one of the following: a maximum temperature rated for the N number of devices and a minimum temperature rated for the N number of devices;
   at least one testing device configured to apply a negative gate bias voltage (Vgs) to the N number of devices;
   the at least one testing device further configured to apply a drain voltage (Vds) to the N number of devices;
   the at least one testing device further configured to measure device currents and/or device voltages of the N number of devices to generate device test data;
   the at least one testing device further configured to determine a failure of one or more of the N number of devices based on the device test data generated from the device currents and/or the device voltages measured by the at least one testing device to generate failure data; and
   the at least one testing device further configured to output the failure data for the N number of devices.

26. The system for testing according to claim 25 wherein the at least one testing device is configured to apply one or more different negative gate bias voltages (Vgs) to the N number of devices.

27. The system for testing according to claim 25 wherein the at least one testing device is configured to apply one or more different drain voltage (Vds) voltages to the N number of devices.

28. The system for testing according to claim 25 wherein the at least one testing device is configured to measure a current on a drain of each of the N number of devices to determine a device failure.

29. The system for testing according to claim 25 wherein:
   the at least one testing device is configured to monitor a testing time of the N number of devices; and
   the at least one testing device is configured to capture the testing time for a particular one of the N number of devices that indicates a device failure along with an identification of the particular failed one of the N number of devices and values of the negative gate bias voltage (Vgs) and the drain voltage (Vds).

30. The system for testing according to claim 25 wherein:
   the at least one testing device is configured to calibrate fields of the N number of devices to determine an effective drain bias; and
   the at least one testing device is configured to extrapolate values of the negative gate bias voltage (Vgs), the drain voltage (Vds), and/or a testing time to determine a lifetime prediction of the N number of devices.

31. The system for testing according to claim 25 wherein the at least one testing device is configured to determine a mean time to failure (MTTF) of each of the N number of devices based on values of the negative gate bias voltage (Vgs), the drain voltage (Vds), and/or a testing time.

32. The system for testing according to claim 25 wherein the at least one testing device is configured to reduce a test time to be 2 times faster to 5 times faster based in part on an application of a negative gate bias voltage (Vgs) to the N number of devices.

33. The system for testing according to claim 25 wherein a test time is less than 9000 hours to achieve a first predetermined confidence level of statistical failure data.

34. The system for testing according to claim 33 wherein a test time is less than 2000 hours to achieve a second predetermined confidence level of statistical failure data, wherein the first predetermined confidence level of statistical failure data is greater than the second predetermined confidence level of statistical failure data.

35. The system for testing according to claim 25 wherein the temperature-controlled environment is configured to maintain a temperature of the N number of devices to be near a maximum temperature rated for the N number of devices.

36. The system for testing according to claim 25 wherein the temperature-controlled environment is configured to maintain a temperature of the N number of devices to be near a minimum temperature rated for the N number of devices.

37. The system for testing according to claim 25 wherein the at least one testing device is configured to apply a near maximum negative gate bias voltage (Vgs) to the N number of devices.

38. The system for testing according to claim 25 wherein the at least one testing device is configured to apply a near maximum drain voltage (Vds) voltage to the N number of devices.

39. The system for testing according to claim 25 wherein the at least one testing device is configured to measure at least one of the following: currents at a gate of the N number of devices, currents at a source of the N number of devices, currents at a drain, voltage at a gate of the N number of devices, voltage at a source of the N number of devices, and voltage at a drain of the N number of devices.

40. The system for testing according to claim 25 wherein the at least one testing device is configured to measure a drain leakage on a drain of each of the N number of devices to determine a device failure.

41. The system for testing according to claim 25 wherein the at least one testing device is configured to apply a negative voltage gate bias voltage (Vgs) to each of the N number of devices to generate fields in each of the N number of devices that are higher than possible for typical test conditions.

42. The system for testing according to claim 25 wherein the at least one testing device is configured to reduce a test time by 30% to 80% in comparison to a test time implemented by prior art test processes.

43. The system for testing according to claim 25 wherein the at least one testing device is configured to reduce a test time by 30% to 80% based in part on an application of a negative gate bias voltage (Vgs) to the N number of devices.

44. The system for testing according to claim 25 wherein the at least one testing device is configured to reduce a test time by 30% to 80% based in part on an application of a negative gate bias voltage (Vgs) to the N number of devices in comparison to a test time implemented by prior art test processes.

45. The system for testing according to claim 25 wherein the at least one testing device is configured to reduce a test time to be 2 times faster to 5 times faster in comparison to a test time implemented by prior art test processes.

46. The system for testing according to claim 25 wherein the at least one testing device is configured to reduce a test time to be 2 times faster to 5 times faster based in part on an application of a negative gate bias voltage (Vgs) to the N number of devices in comparison to a test time implemented by prior art test processes.

47. The system for testing according to claim 25 wherein the at least one testing device is configured to apply a negative gate bias voltage (Vgs) to the N number of devices to increase an electric field in regions of the N number of devices resulting in faster failure rates.

48. The system for testing according to claim 25 wherein the at least one testing device is configured with the temperature-controlled environment to isolate effects of a gate field and a semiconductor field to reveal a failure mechanism.

49. A process for testing semiconductor power devices comprising:
   arranging an N number of devices in a temperature controlled environment such that a temperature of the N number of devices is near one of the following: a maximum temperature rated for the N number of devices and a minimum temperature rated for the N number of devices;
   measuring with at least one testing device currents and/or device voltages of the N number of devices to generate failure data; and
   outputting with the at least one testing device the failure data for the N number of devices,
   wherein a test time is reduced by 30% to 80% in comparison to a test time implemented by prior art test processes.

50. The process for testing according to claim 49 further comprising determining a mean time to failure (MTTF) of each of the N number of devices based on values of a gate bias voltage (Vgs), a drain voltage (Vds), and/or a testing time.

51. The process for testing according to claim 49 wherein a test time is less than 9000 hours to achieve a first predetermined confidence level of statistical failure data.

52. The process for testing according to claim 51 wherein a test time is less than 2000 hours to achieve a second predetermined confidence level of statistical failure data.

53. The process for testing according to claim 49 wherein a test time is reduced by 30% to 80% based in part on an application of a negative gate bias voltage (Vgs) to the N number of devices in comparison to a test time implemented by prior art test processes.

* * * * *